United States Patent [19]

Ota et al.

[11] Patent Number: 6,097,473
[45] Date of Patent: *Aug. 1, 2000

[54] EXPOSURE APPARATUS AND POSITIONING METHOD

[75] Inventors: Kazuya Ota, Tokyo; Shigeru Nakayama, Kanagawa-ken, both of Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/880,437

[22] Filed: Jun. 23, 1997

Related U.S. Application Data

[63] Continuation of application No. 08/471,519, Jun. 6, 1995, abandoned.

[30] Foreign Application Priority Data

Jul. 27, 1994 [JP] Japan .................................. 6-175842

[51] Int. Cl.[7] .......................... G03B 27/42; G01B 11/00
[52] U.S. Cl. ............................. 355/53; 356/400; 356/401
[58] Field of Search ....................... 355/53, 67; 356/400, 356/401

[56] References Cited

U.S. PATENT DOCUMENTS

| | | | |
|---|---|---|---|
| 4,711,567 | 12/1987 | Tanimoto | 355/53 |
| 4,741,622 | 5/1988 | Suwa et al. | |
| 4,794,426 | 12/1988 | Nishi | 355/52 X |
| 4,853,745 | 8/1989 | Kamiya et al. | 355/53 X |
| 5,003,342 | 3/1991 | Nishi | |
| 5,148,214 | 9/1992 | Ohta et al. | |
| 5,245,863 | 9/1993 | Kajimura et al. | 356/376 X |
| 5,448,332 | 9/1995 | Sakakibara et al. | 355/53 |
| 5,477,309 | 12/1995 | Ota et al. | 355/53 X |
| 5,521,036 | 5/1996 | Iwamoto et al. | |

OTHER PUBLICATIONS

"AFM Lithograph (I)", Report No. 27p–Q–14, Japanese Applied Physical Society (1993).
"AFM Lithography (II)", Report No. 30p–MB–18, Japanese Applied Physical Society, (1994).

*Primary Examiner*—Fred L. Braun
*Attorney, Agent, or Firm*—Armstrong, Westerman, Hattori, McLeland & Naughton

[57] ABSTRACT

An exposure apparatus exposes a pattern formed on a mask to a substrate having an alignment with a difference in level and a photosensitive material applied on the surface of the substrate. The exposure apparatus includes a stage adapted to hold the substrate and two-dimensionally movable in a predetermined plane; a sensor held in a predetermined relationship with respect to the plane and outputting a signal which varies in response to a relative movement between the sensor and the substrate in a direction perpendicular to the plane; a position detecting device for detecting the position of the stage; an arithmatic unit for calculating the position of the alignment mark on the basis of information from the position detecting device and an output outputted from the sensor when the stage and the sensor are moved relative to each other; and a control system for controling movement of the stage on the basis of the position of the alignment mark. A method is also provided for positioning of and measurement of alignment marks formed on a substrate.

60 Claims, 8 Drawing Sheets

EXPOSURE APPARATUS AND POSITIONING METHOD

This application is a Continuation of application Ser. No. 08/471,519 filed Jun. 6, 1995, now abandoned.

BACKGROUND OF THE INVENTION

1. Field of the Invention

The present invention relates to an exposure apparatus for manufacturing, for example, semiconductor integrated circuits and liquid crystal device substrates, and a positioning method for positioning the circuits and substrates.

2. Description of the Prior Arts

Step-and-repeat reduction projection exposure apparatuses (hereafter referred to as "steppers") play a central role in lithography processes in the manufacture of semiconductor integrated circuits. As alignment mark detection means used in the steppers to align the projected image of a circuit pattern formed on a reticle (that may hereafter be represented by a "mask" that is a superordinate concept of the reticle) with a circuit pattern (hereafter referred to as a chip) already formed on a photosensitive substrate (hereafter referred to as a "wafer"), there exist a laser step alignment system (LSA system) which receives a diffracted and scattered light from an alignment mark on a wafer by relatively moving a slit-like laser beam and the alignment mark, and a field image alignment system (FIA system) which takes an image of an alignment mark on a wafer using a TV camera.

An LSA system of a TTL (through-the-lens) type projects a spot light with a cross section like a band on a wafer via a projection optical system. The spot light scans the wafe r placed on a stage, and a scattering light from an alignment mark on the wafer, which is g enerated when the alignment mark crosses the spot light, are detected to locate the mark.

An FIA system of an OFF-AXIS type projects light with multiple wave lengths against the alignment mark on the wafer, detects reflected light using an image sensor, and image-processes the output from the image sensors to detect the position of the mark.

Since conventional alignment systems detect the position of an alignment mark on a photosensitive substrate by projecting light onto the mark, detection errors often occur due to interference by a photosensitive layer on the mark. FIA system is subject to errors in detecting marks with a small height, while LSA system suffer from errors in detecting asymmetric marks. A first problem is t hat such detection errors reduce the accuracy of registration. Registration is a technique for maintaining a projected image of pattern on a mask and a mark on the photosensitive substrate in a specified relationship when the pattern is projected on a substrate by carrying out alignment using the mark as an index.

A second problem is that a registration error (positioning error) occurring during exposure cannot be detected until development is finished. A third problem is that the method for detecting a registration error after development is time-consuming.

SUMMARY OF THE INVENTION

It is a primary object of this invention to provide an exposure apparatus that prevents the degradation of registration accuracy due to an error in the detection of an alignment mark.

It is another object of this invention to provide an exposure apparatus that prevents the degradation of registration accuracy by obtaining a signal according to the shape of an alignment mark whether it has a low height or an asymmetric shape.

It is yet another object of this invention to provide an exposure apparatus that prevents the degradation of registration accuracy by detecting the position of an alignment mark accurately.

It is yet another object of this invention to provide an exposure apparatus that prevents the degradation of registration accuracy by outputting the movement of a stage as sampling pulses, and sampling and arithmetically processing the sampling pulses.

It is yet another object of this invention to provide a method for detecting a registration error before development to accurately position a substrate during superposition exposure.

It is yet another object of this invention to provide a method for using latent images to measure baseline errors in order to correct the baseline quantity, thereby accurately positioning a substrate during superposition exposure.

A first aspect of this invention is applicable to an exposure apparatus including a moving stage (wafer stage 9) on which a photosensitive substrate (wafer W) is placed, the apparatus exposing the substrate with a pattern formed on a mask. The exposure apparatus according to this invention comprises a mark detection device for detecting alignment marks provided on the photosensitive substrate in terms of the difference in level and outputting detected signals; a stage position detection device for detecting the moving coordinates of a stage; and an arithmetic unit for outputting the mark position coordinates of the alignment mark based on at least one pair of the moving coordinates obtained by the stage position detection device when the signal detected by the mark position detection device varies.

The stage position detection device may output sampling pulses according to the displacement of the stage, and the arithmetic unit may use the sampling pulses to sample detected signals outputted from the mark position detection device, and arithmetically processes the signals obtained. A probe may scan the surface of the photosensitive layer keeping a predetermined distance from the surface constant in such a way that the inter-atomic force between itself and the surface is kept constant.

The exposure apparatus according to this invention may further include a probe position detection device for outputting sampling pulses according to the relative movement of the probe, and the arithmetic unit uses both sampling pulses from the stage position detection device and sampling pulses from the p robe position detection device to sample detected signals outputted from the mark detection device and arithmetically processes the detected signals obtained, thereby outputting the mark position coordinates of the alignment mark.

A second aspect of this invention that is a positioning method (registration error detection method) which first prepares a photosensitive substrate having a plurality of processing regions each of which has a first alignment mark formed in a predetermined position, a mask with a pattern including a second alignment mark, and a stage on which the photosensitive substrate is placed and which can move in the two-dimensional direction parallel to the surface of the photosensitive substrate. An "operation for moving the stage to move the photosensitive substrate to a first position in which the alignment device can detect the first alignment mark in one of the plurality of processing regions, and causing the alignment device to detect the position coordinates of the mark" is repeated sequentially to detect the position coordinates of the respective first alignment marks in some processing regions. A statistical arithmetic process is then performed based on these position coordinates to determine the position coordinates of the respective first alignment marks in all the processing regions. The photosensitive substrate is then moved to an exposure position by moving the stage based on (1) a base-line value representing the distance between the first position and a second position that is a reference point projected on the photosensitive substrate and (2) the position coordinates of the respective first alignment marks in specified processing regions which have been determined in the third step. The second alignment mark is exposed to form a latent image of the mark on the photosensitive substrate. The probe scans the surface of the photosensitive substrate at a specified distance from the surface in such a way that the interatomic force between itself and the surface is maintained to be constant, thereby detecting the first alignment mark and the latent image in terms of the difference in level to detect the positional displacement or offset between the first alignment mark and the latent image. The stage is moved to the exposure position based on at least the (1) position coordinates determined during the third step, (2) base-line value, and (3) positional displacement or offset detected during the sixth step. Positioning is performed in this manner.

The photosensitive substrate may be replaced between the sixth and the seventh steps (an eighth step). In this case, an "operation for moving the stage to move the photosensitive substrate to a first position in which the alignment device can detect the first alignment mark in one of the plurality of processing regions, and causing the alignment device to detect the position coordinates of the mark" is repeated sequentially to detect the position coordinates of the respective first alignment marks in some processing regions (a ninth step). Statistical arithmetic operations are then performed based on the position coordinates detected during the ninth step to determine the position coordinates of the respective first alignment marks in all the processing regions (a tenth step). The seventh step is substituted by a 7'th step wherein the stage is moved to the exposure position based on at least the (1) position coordinates determined during the tenth step, (2) base-line value, and (3) positional displacement or offset detected during the sixth step. Positioning may also be carried out in this manner.

DESCRIPTION OF THE PREFERRED EMBODIMENTS

Figure 1:
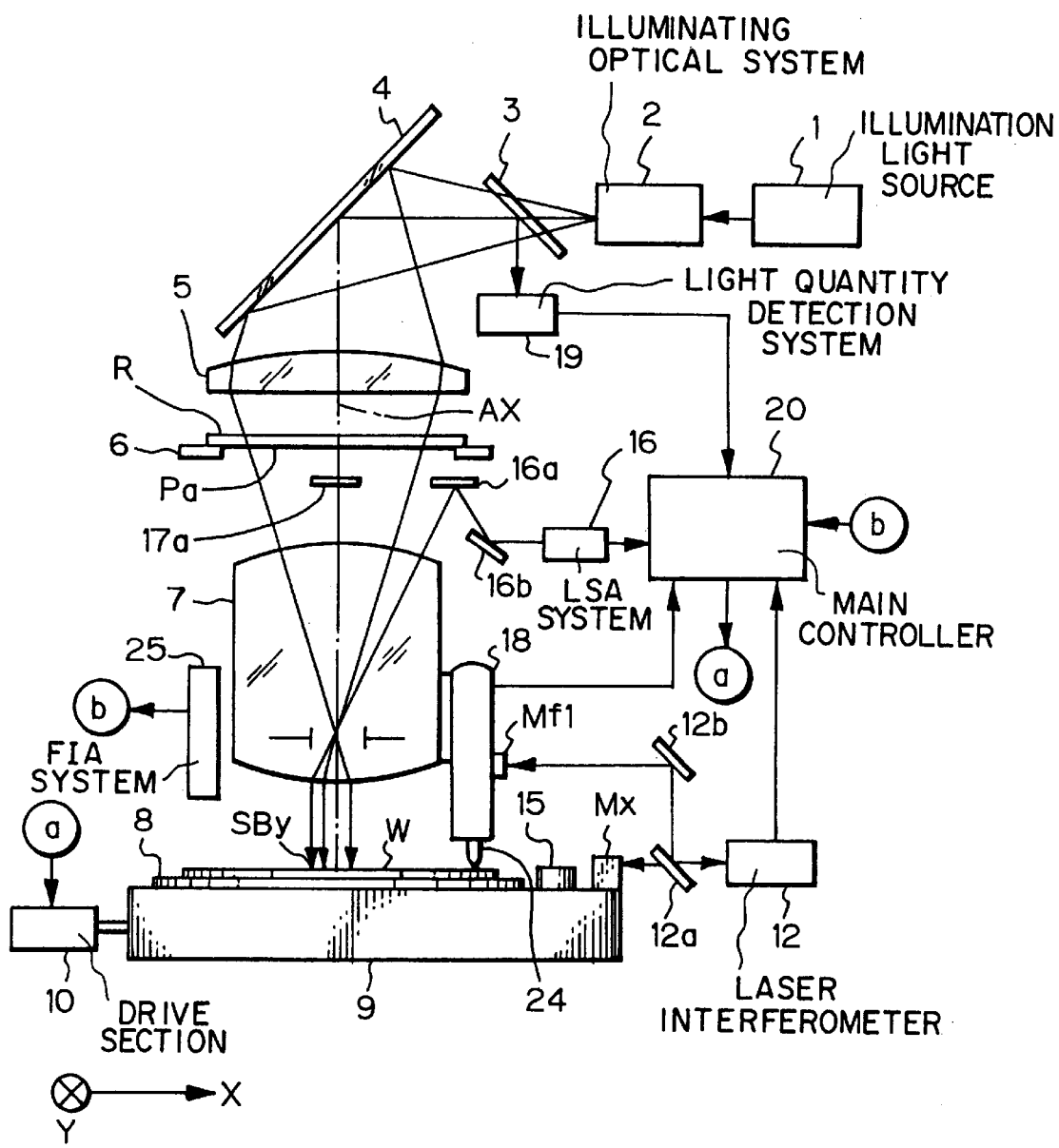
FIG. 1 is a plan view showing the approximate configuration of a stepper including an interatomic force microscope as a wafer alignment system according to one embodiment of this invention.

A first embodiment of this invention is described below with reference to the drawings. FIG. 1 shows the approximate configuration of a stepper according to the first embodiment of this invention which includes an interatomic force microscope as a wafer alignment system.

In this figure, an illumination light source for exposure 1 generates an illumination light of a wave length (exposure wave length) to which a resist is sensitive, for example, (g) or (i) beams. The illumination light passes through an illuminating optical system 2 comprising a fly eye lens to uniformize the illumination light and a beam splitter 3 to a condenser lens 5 via a mirror 4. The light then illuminates a pattern region Pa on a reticle R retained on a reticle stage 6 at a uniform illumination. Alignment marks Sx, Sy (rectangular transparent windows; not shown) are formed on the reticle R and extend in the Y and X directions within the pattern region Pa. In FIG. 1, the X direction extends from left to right, while the Y direction extends from the front of the sheet of this drawing toward its rear. A projection lens 7 one side (or both sides) of which is telecentric projects on a wafer W coated with a photoresist, the image of a circuit pattern drawn on the pattern region Pa of the reticle R.

A wafer holder (Θ table) 8 is placed on a wafer stage 9, and a wafer W is held by vacuum suction by means of the wafer holder 8. The wafer stage 9 is moved two-dimensionally by drive sections 10, 11 within the X-Y plane perpendicular to the optical axis AX of the projection lens 7. A laser interferometer 12 irradiates laser beams via a beam splitter 12a and a reflecting mirror 12b to both a moving mirror Mx installed on the wafer stage 9 and a fixed lens Mf1 installed on an interatomic force microscope 18 (described below in detail) fixed integrally to the projection lens 7. The laser interferometer 12 is configured to photoelectrically detect interference fringes generated by beams reflected by both the moving mirror Mx and the fixed mirror Mf1 using its light-receiving surface, thereby detecting the position of the wafer stage 9 in the X direction.

A reference member 15 such as a glass plate which includes reference marks (fiducial marks) and transmits light is installed on the wafer stage 9 in such a way that the surface of the reference member is approximately flush with the surface of the wafer W in the direction along the optical axis of the projection lens 7.

Figure 6A:
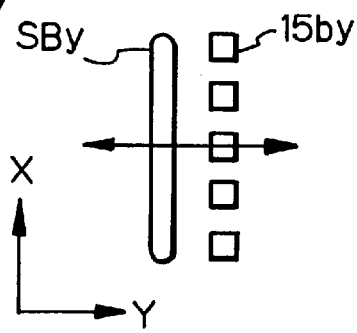
FIG. 6(a) shows a spot light from an LSA system scanning diffraction grating marks.
Figure 6B:
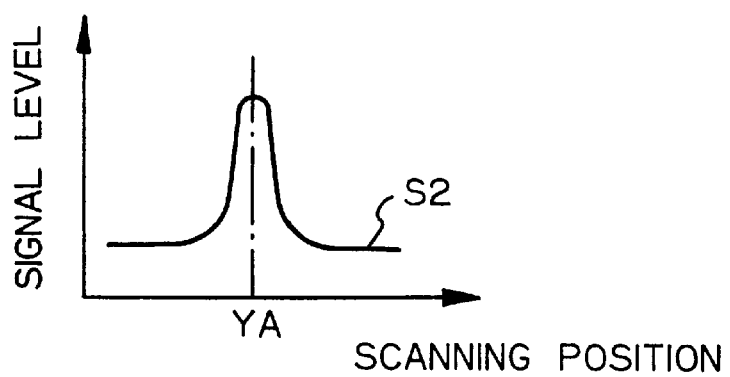
FIG. 6(b) shows the waveform of a photoelectric signal obtained when a spot light from the LSA system scans the diffraction grating marks.

This exposure apparatus includes laser step alignment systems (LSA systems) 16, 17 of a through-the-lens (TTL) type. These LSA systems 16, 17 (regarding LSA system 17, mirror 17a is shown, but other members of that system are not shown) are used to detect the positions of the alignment marks on the wafer W or the diffraction grating marks on the reference member 15. In this case, the LSA systems 16, 17 photoelectrically detect diffracted lights from the diffraction grating marks and outputted the detection signals to a main controller 20. The laser interferometers 12, 13 outputs to the main controller 20 sampling pulses outputted based on the movement of the stage. The main controller 20 samples the detection signals using the sampling pulses, and arithmetically processes the sampled signals to detect the positions of the diffraction grating marks (or the alignment marks on the wafer W) on the reference member 15. FIG. 6 shows a detection signal obtained when a beam SBy from the LSA system 17 scans diffraction grating marks 15by.

An FIA system 25 is installed as an OFF-AXIS alignment system at a predetermined distance from the projection lens 7. This will be described later.

Figure 2:
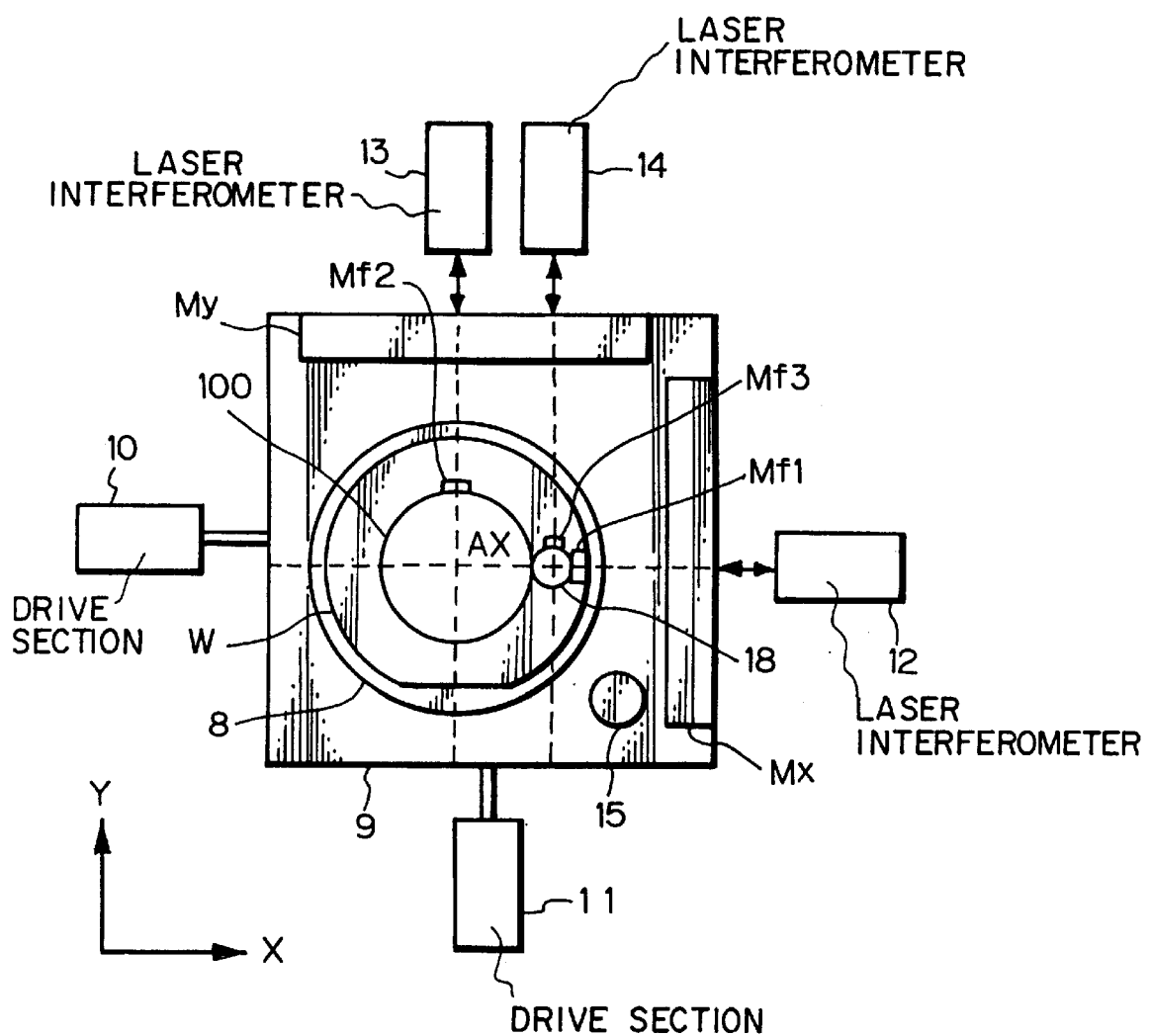
FIG. 2 is a plan view showing the approximate arrangement of the atomic force microscope and position detection systems.

FIG. 2 shows the approximate arrangement of the interatomic force microscope 18 and a position detection system. As shown in the figure, the laser interferometer 13 radiates laser beams against both the moving mirror My mounted on the wafer stage 9 and the fixed mirror Mf2 installed on the lens barrel of the projection lens 7. The laser interferometer 13 detects the position of the wafer stage 9 in the Y direction by photoelectrically detecting interference fringes generated by beams reflected by both the moving mirror My and the fixed mirror Mf2 using its light-receiving surface. The laser interferometer 14 irradiates laser beams to both the moving mirror My mounted on the wafer stage 9 and the fixed mirror Mf3 installed on the lens barrel of the inter-atomic force microscope 18. The laser interferometer 14 can also detect the position of the wafer stage 9 in the Y direction by photoelectrically detecting interference fringes generated by beams reflected by both the moving mirror My and the fixed mirror Mf3 using the light-receiving surface.

The center lines (measuring axes) of laser beams from the laser interferometers 12, 13 are arranged to intersect each other within the same plane with the optical axis AX of the projection lens 7 passing through the intersection of these two lines. The center lines of laser beams from the laser interferometers 12, 14 are arranged to intersect each other within the same plane with the optical axis AX of the interatomic force microscope 18 passing through the intersection of these two lines. In addition, the plane containing the three measuring axes of the laser interferometers 12, 13, and 14 are located to be approximately flush with the image-formation surface of the projection lens 7. In this manner, the laser interferometers 12, 13 are configured so that the Abbe error becomes approximately zero relative to the exposure position, while the laser interferometers 12, 14 are configured so that the Abbe error becomes approximately zero relative to the alignment position.

Figure 3:
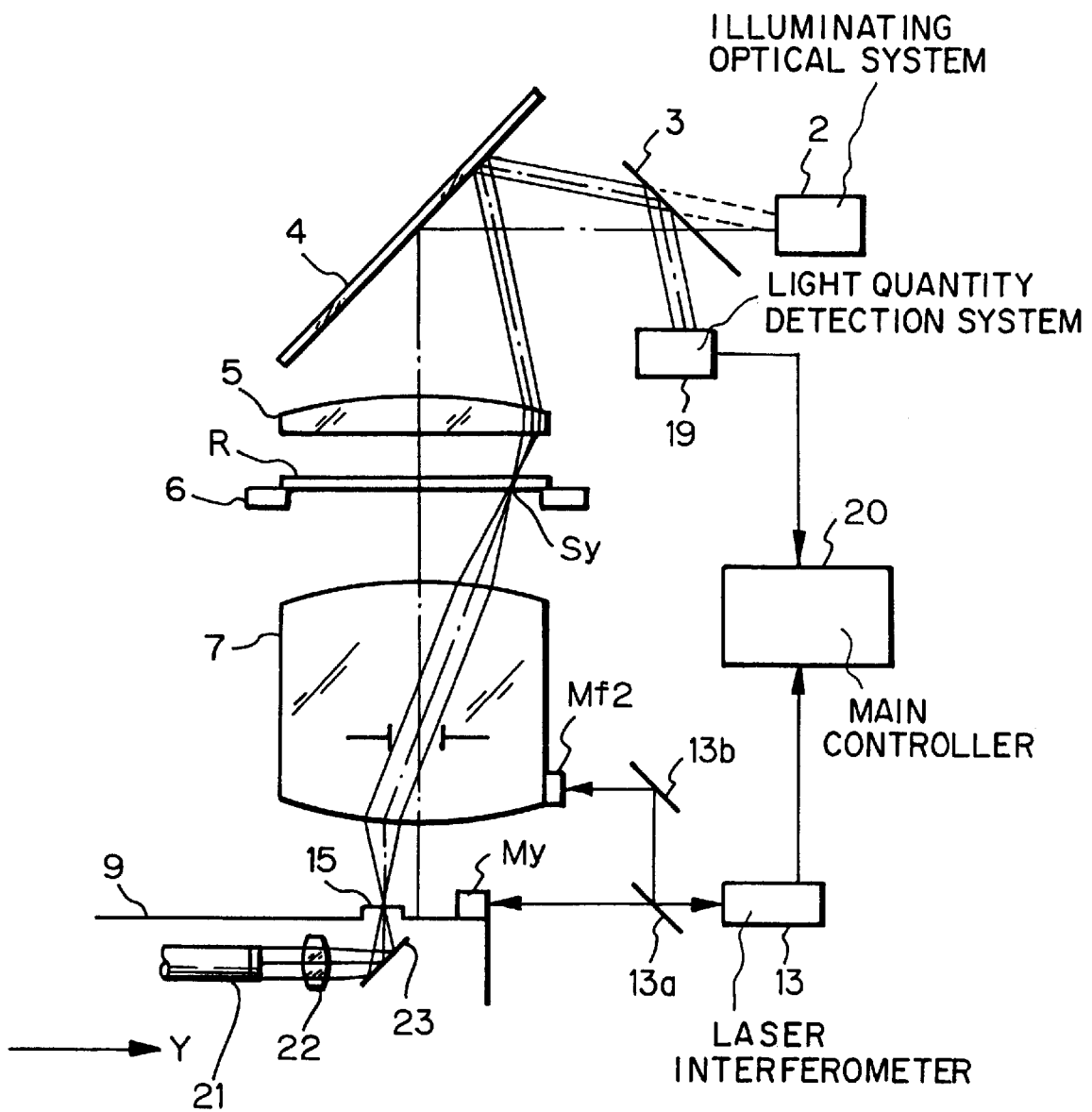
FIG. 3 is a schematic plan view describing the operation of baseline measurements.
Figure 5A:
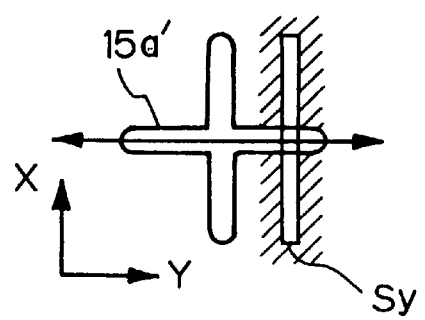
FIG. 5(a) shows a projected image of a cross pattern scanning an alignment mark on a reticle.

FIG. 3 partially shows the apparatus in FIG. 1 to describe a baseline measuring operation for measuring the positions of the alignment marks on the reticle R and the position of the OFF-AXIS alignment system on the stage coordinate system. Exposure lights transmitted through optical fibers 21 illuminate the reference member 15 from below via a lens 22 and a mirror 23. The exposure lights then pass through the projection lens 7 and form on the pattern surface of the reticle a projected image 15a' of a cross pattern 15a provided on the reference member. The wafer stage 9 is movable by small amounts in the Y direction to cause the projected image 15a' to relatively scan the alignment mark Sy formed on the reticle R in the Y direction, as shown in FIG. 5(a). Lights transmitted through the alignment mark Sy enter a light quantity detection system 19 via the condenser lens 5, mirror 4, and beam splitter 3, and the light quantity detection system 19 outputs detected signals to the main controller 20.

Figure 4:
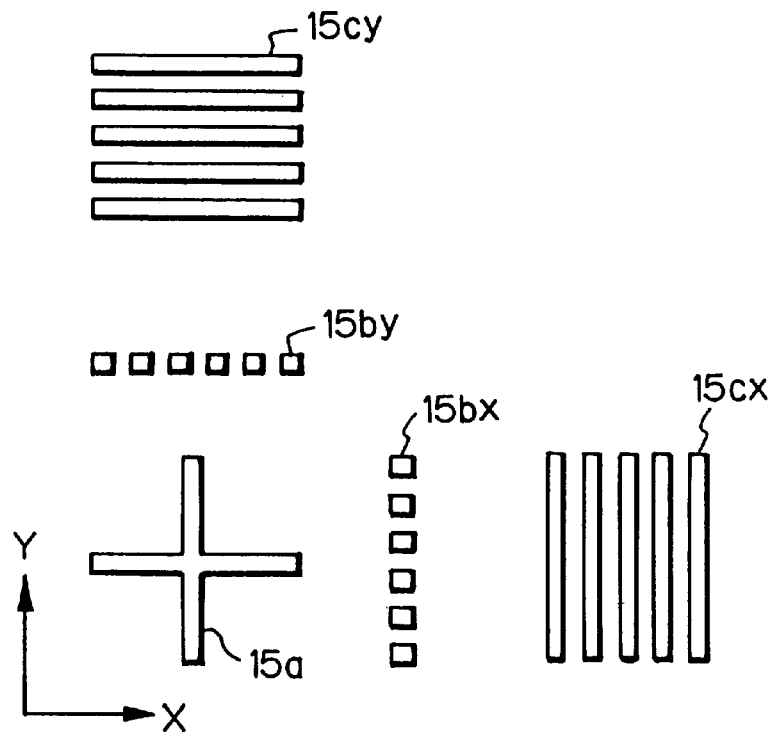
FIG. 4 is a layout drawing of marks on a reference member.

FIG. 4 is a layout drawing of marks on the reference member 15. The reference member 15 has formed thereon a cross pattern 15a that is a light-transmittivity slit pattern, diffraction grating marks 15bx, 15by formed of light-reflecting chromium layers with a difference in level and extending in the X and Y directions, respectively, and diffraction grating marks 15cx, 15cy also formed with difference in level.

Figure 7A:
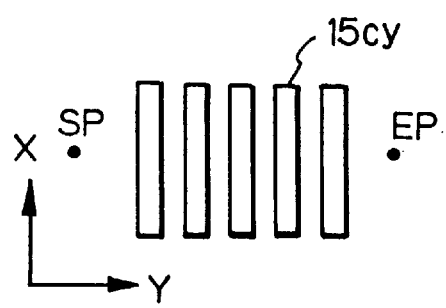
FIG. 7(a) shows grating marks on the reference member.
Figure 7B:
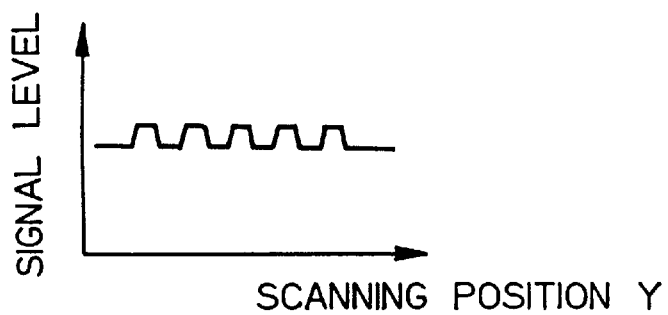
FIG. 7(b) shows a signal obtained when the marks are detected by the atomic force microscope.

Referencing FIG. 1, the interatomic force microscope 18 is described. The interatomic force microscope 18 has a probe 24 constituted to move perpendicularly to the wafer W by means of a drive device (not shown). The drive device positions the probe 24 at a very short distance (that is, a distance at which atoms on the tip of the probe repel atoms on the wafer W) from the wafer W or reference member 15. The probe 24 is set so as to move perpendicularly to the wafer W due to the repulsion between atoms on the probe 24 and atoms on the wafer W. When the probe 24 is relatively scanning the wafer stage 9 and if there is a difference in level thereon, the probe 24 moves perpendicularly from the surface of the wafer W so as to maintain the repulsion at a predetermined value. The interatomic force microscope 18 converts the amount of movement into an electric signal to output it to the main controller 20. FIG. 7(a) shows the diffraction grating marks 15cy on the reference member 15 and FIG. 7(b) shows a detected waveform when the marks are detected. During the detection of the alignment marks, the probe 24 is positioned at a very small distance from the wafer W while making measurements, whereas it is separated from the wafer W when it is not making measurements.

Referencing FIGS. 7(a) and 7(b), the detection of the positions of the marks using the interatomic force microscope 18 is described using a mark position detection operation for detecting the diffraction grating marks 15cy on the reference member 15. The wafer stage 9 first moves so that the interatomic force microscope 18 is positioned over the reference member 15 and several tens $\mu$m from the end of the diffraction grating marks 15cy on the member 15 in the mark scanning direction (the direction from SP to EP in FIG. 7(a)) (a scanning start position SP in FIG. 7(a)). The probe 24 lowers to a position in which the stages on the reference member 15 can be detected, and the wafer stage 9 moves to the scanning end position EP in the direction in which the probe 24 detects the difference in level of the diffraction grating marks 15cy. At this point, the interatomic force microscope 18 converts the amount of movement of the probe 24 in the direction perpendicular to the wafer W into an electric signal, and outputs it to the main controller 20. The laser interferometers 13, 14 also output the sampling pulses outputted depending on the movement of the wafer stage 9 to the main controller 20. The main controller 20 samples signals from the interatomic force microscope 18 using sampling pulses in such a way that sampled signals correspond to the positional information on the stage, and arithmetically processes the sampled signals to detect the position coordinates of the center of the mark.

In these arithmetic processions, for example, the peak value of the sampled signals is detected to determine the position of the wafer stage corresponding to this value as the position of the mark. In other cases, a certain slice level is set to determine as the position of the mark the midpoint between two points that are the intersections of sampled signals and the slice level.

The interatomic force microscope 18 can detect both alignment marks in the X direction and alignment marks in the Y direction.

Next, the operation for measuring the base-line value that is the positional relationship on the coordinate system on the wafer stage 9 between the alignment marks Sx, Sy on the reticle R and the alignment sensor (the interatomic force microscope 18) in the apparatus configured according to this embodiment is described.

Figure 5B:
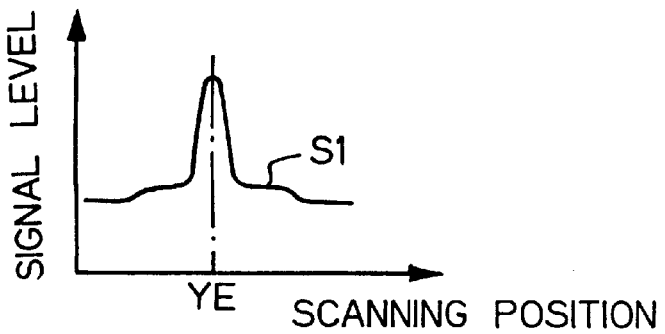
FIG. 5(b) shows the waveform of a photoelectric signal obtained when the projected image of the cross pattern scans the alignment mark on the reticle.

An exposure light exiting from under the cross pattern 15a on the reference member 15 scans the alignment mark Sy on the reticle R in the Y direction. This causes the light quantity detection system 19 to output detected signals to the main controller 20, as described above. During this scanning process, the laser interferometer 13 outputs sampling pulses to the main controller 20. The main controller 20 arithmetically processes the detected signals to calculate the coordinate position. In this case, the maximum light quantity is transmitted when the center of the projected image 15a' coincides with the center of the alignment mark Sy, with the light quantity decreasing sequentially according to the offset between the two centers. Lights transmitted through the alignment mark Sy are converted photoelectrically by the light quantity detection system 19. FIG. 5(b) shows a photoelectric signal S1 obtained. In this figure, the position in which the photoelectric signal S1 is at its peak is the position in which the center of the projected image 15a' coincides with the center of the alignment mark Sy, that is, the position of the alignment mark Sy in the Y direction.

The wafer stage 9 then moves so that the interatomic force microscope 18 can detect the positions of both the cross pattern 15a on the reference member 15 and the diffraction grating marks 15cy arranged thereon in a predetermined relationship. The relative scanning by the wafer stage 9 enables the interatomic force microscope 18 to detect the grating marks 15cy to determine the coordinate position of the interatomic force microscope 18 in the Y direction. FIG. 7(a) shows the grating marks 15cy and FIG. 7(b) shows an output from the interatomic force microscope 18.

The positional relationship between the alignment mark Sy and the interatomic force microscope 18 in the Y direction (the base-line in the Y direction) can be determined using the position of the alignment mark on the coordinate system on the wafer stage 9, the positional relationship between the cross pattern 15a and the grating marks 15cy, and the coordinate position of the interatomic force microscope 18 with respect to the wafer stage 9 in the Y direction.

Similarly, the positional relationship between the alignment mark Sx and the interatomic force microscope 18 in the X direction (the base-line in the X direction) can be determined using the cross pattern 15a and the grating marks 15cx on the reference member 15.

The main controller 20 may average the results of the scanning of the grating marks by the interatomic force microscope 18 by allowing the microscope to scan the same position a plurality of times. In this case, the interatomic force microscope 18 may repeat an operation a plurality of times in which it moves perpendicularly to the scanning direction for a very small distance and then starts scanning again, thereby compensating for errors due to the shapes of the marks. This is also true of the detection of the alignment marks on the wafer W.

Next, the alignment operation for the wafer W is described. The wafer W is placed on the wafer stage 9 in such a manner that its notches (hereafter referred to as the "OFs") arranged in a determined pattern are directed in approximately the same direction. This operation for directing the wafer W to a predetermined direction is performed by a pre-alignment device (not shown) using the OFs of the wafer W. The main controller 20 detects an angular offset in the direction of rotation of the wafer W relative to the direction of movement (X direction or Y direction) of the wafer stage 9 by using the LSA system 16 to detect the positions of the two Y alignment marks on the wafer. The main controller thus rotates the wafer W so that the direction of movement of the wafer stage 9 coincides with the direction of the wafer W. It further detects the positions of the Y alignment marks and also detects the alignment mark in the X direction by LSA system 17. This operation enables the coordinate system for the wafer stage 9 to correspond to the coordinate system arranged on the wafer W.

The interatomic force microscope 18 detects the alignment marks on the wafer W, and exposure is carried out based on the detected positions of the alignment marks. Specific alignment methods include, for example, detecting the positions of the respective marks for several shots on the wafer W to determine the arrangement of the shots on the wafer W from the positional coordinates of the marks for the shots using statistical arithmetic processes. In these processes, the shot arrangement coordinates are calculated in such a way that correction values for the offset in the X and Y directions, wafer rotation, and scaling in the X and Y directions, and orthogonally of the X and Y axes will each be minimum. The wafer stage 9 is then moved based on the determined shot arrangement coordinates and base-line value, and exposure is then executed. This alignment method is called an EGA method and disclosed in Japanese Patent Laid-Open Publication No. Sho 61-44492. Exposure may be carried out by a site-by-site alignment method wherein the position of an alignment mark is detected for each exposure shot on the wafer W and the shot area is then moved to the exposure position based on this position of the mark and the base-line value.

Figure 8A:
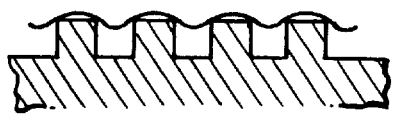
FIG. 8(a) shows a cross section of alignment marks on the wafer coated with a resist.
Figure 8B:
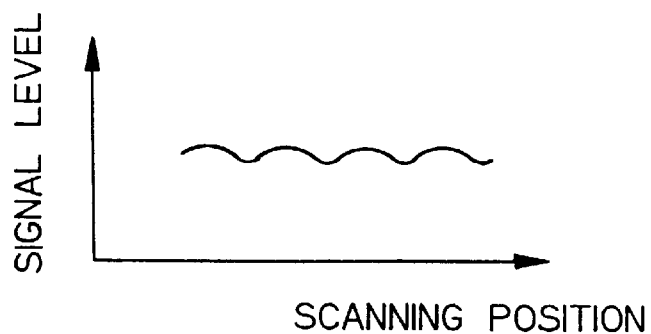
FIG. 8(b) shows a signal obtained when the marks are detected by the inter-atomic force microscope.

The detection of the marks in this alignment method is described. To detect the position in the X direction, the wafer stage 9 moves to a position specified for the marks to be detected, and the probe 24 of the interatomic force microscope 18 in the stand-by state lowers toward the wafer W. The wafer stage 9 moves in the X direction for which the marks should be detected. At this point, the main controller 20 receives both detected signals from the interatomic force microscope 18 and sampling pulses output by the laser interferometer 12 for each small movement to sample the detected signals. FIGS. 8(a) and 8(b) show a cross section of the marks on the wafer W to be detected and a detected waveform of the marks, respectively. The coordinate positions of the marks can be detected by arithmetically processing waveforms obtained by this sampling. When the wafer stage 9 is moved to another position for mark detection, this cannot be done until the probe 24 has moved upward and left the wafer W.

In this manner, signals (to be precise, signals for a resist image) can be obtained according to the shape of the alignment mark by using the interatomic force microscope 18 to detect the mark, even if the mark has a small difference in height or an asymmetric shape. The detection error in the detection of the position of the mark can thus be eliminated by performing arithmetic processes for the mark position detection according to such a small difference in height or an asymmetric shape.

Next, a second embodiment is described. In this embodiment, the apparatus in FIG. 1 also has a laser interferometer 26 for detecting the movement of the probe 24 of the interatomic force microscope 18 relative to the fixed mirror Mf1 attached to the microscope 18. When the interatomic force microscope 18 is used to detect the alignment mark, the probe 24 may be slightly deflected due to the effect of the difference in height of the mark. It is the object of this embodiment to detect the deflection of the probe 24 of the interatomic force microscope 18 to precisely detect the location or position of the mark.

Figure 9:
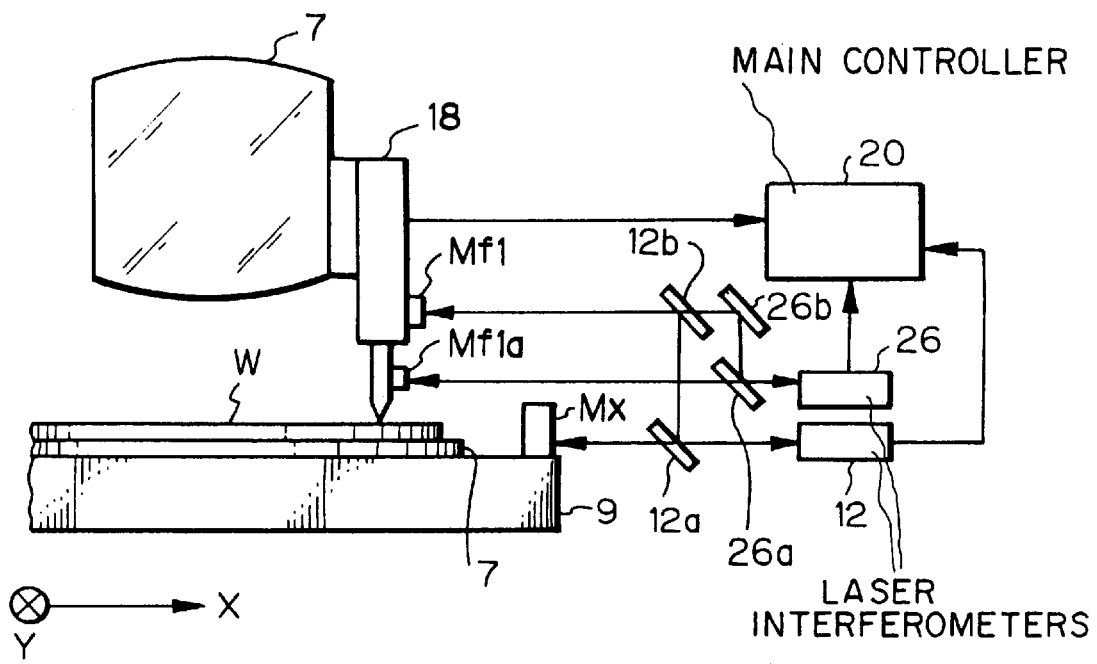
FIG. 9 shows the integral part of a second embodiment of this invention.

The configuration according to this embodiment is described with reference to FIG. 9. FIG. 9 shows modifications of the first embodiment. The probe 24 has a fixed mirror Mf1a attached thereto in such a way that the mirror can reflect laser beams from the laser interferometer 26. The laser interferometer 26 irradiates the fixed mirrors Mf1 and Mf1a with laser beams using a beam splitter 26a and a reflecting mirror 26b. When the probe 24 detects the alignment mark on the reference member 15 or the wafer W, the laser interferometer 26 outputs sampling pulses to the main controller 20 according to the movement of the probe 24 in the X direction. This interferometer 26 enables the amount of movement of the probe 24 to be detected.

The operation for detecting the position of the mark using the interferometer 26 is described. If the marks shown in FIG. 7(a) are to be detected, the wafer stage 9 is moved so that the probe 24 is positioned in the scanning start position SP, as described in the first embodiment. As in the first embodiment, the probe 24 then lowers toward the wafer W, and the wafer stage 9 is moved so as to relatively move the probe to the scanning end position EP. In this embodiment, as the probe 24 is lowered toward the wafer W, the laser interferometer 26 irradiates the fixed mirror Mf1a with laser beams, and outputs sampling pulses to the main controller 20 according to the amount of movement of the probe 24 in the X direction. In addition, the laser interferometer 12 outputs to the main controller 20 sampling pulses output according to the amount of movement of the wafer stage 9, while the interatomic force microscope 18 outputs to the main controller 20 detected signals that are electric signals obtained by converting the amount of movement of the probe 24 in the direction perpendicular to the wafer W.

The main controller 20 samples detected signals from the interatomic force microscope 18 by using sampling pluses from the laser interferometers 12 and 26 to allow the positional information on the stage to correspond to the positional information on the probe. Specifically, a detected signal from the interatomic force microscope 18 is sampled when a sampling pulse is outputted from the interferometer 12 and also when a sampling pulse is outputted from the laser interferometer 26. This enables the sampling of the amount of movement of the probe 24 in the direction perpendicular to the wafer W in the position based on the sum of the positional information on the stage and the positional information on the probe. The position of the mark can be determined by arithmetically processing the sampled positional information. In this case, since two types of sampling pulses are used to sample signals, two or more signals may be generated in the same coordinate position on the wafer stage 9 if, for example, the probe 24 is moved in the direction opposite to the movement of the stage 9. The average of these signals can then be determined as the signal in the coordinate position.

Although this embodiment has been described in conjunction with the detection of the mark in the X direction, similar detection can be carried out in the Y direction by installing a fixed mirror on the probe 24 and irradiating it with laser beams from the laser interferometer to detect the movement of the probe 24.

The method for processing sampling pulses from the laser interferometers 12 and 26 is not limited to the above method. Signals can also be sampled while correcting positional information on the stage from the laser interferometer 12 based on positional information on the probe from the laser interferometer 26. In this case, the amount of movement of the probe 24 in the direction perpendicular to the wafer W is sampled using only the sampling pulse from the interferometer 12, and the positional information on the stage is the sum of this information itself and the positional information on the probe. Any other processing is possible only if positional information on the stage plus positional information on the probe can be obtained from positional information from the laser interferometers 12 and 26.

In the first and second embodiments, only the interatomic force microscope 18 is provided as the wafer alignment system in addition to the LSA system. An FIA system 25 can, however, be provided as the wafer alignment system in addition to the interatomic force microscope 18 to enable the selection of a wafer alignment system according to the conditions of the alignment marks. For asymmetric marks, if the difference in height of the marks are large enough to be detected by the FIA system, the FIA system 25 can be selected for the detection of the positions of the marks. In addition, in this embodiment, although the interatomic force microscope 18 is used in the base-line measurement to detect both the cross pattern 15a on the reference member 15 and the grating marks 15cx, 15cy arranged thereon in a predetermined relationship, only the cross pattern 15a may be detected in terms of the difference in level.

A third embodiment is described. This embodiment employs an apparatus with the configuration of the first embodiment further provided with an OFF-AXIS alignment system other than the interatomic force microscope 18 which is installed at a predetermined distance from the projection lens 7. In this embodiment, as the OFF-AXIS alignment system shown in FIG. 1, an FIA system 25 is installed opposite to the interatomic force microscope 18 with respect to the optical axis of the projection lens 7.

A registration error detection method wherein this FIA system 25 is used to execute alignment for exposure is described below. A base-line measurement for the FIA system 25 is first carried out. This base-line measurement is similar to that for the interatomic force microscope 18, and the positional relationship between the alignment marks Sx, Sy on the reticle R and the FIA system 25 is determined using the marks on the reference member 15. In this embodiment, a mark for the FIA system 25 (not shown) is provided on the reference member 15 and used for detection.

After the base-line measurement, the wafer W is exposed. As in the first embodiment, the wafer W is placed on the wafer stage 9 in such a manner that its OFs are directed approximately to a predetermined direction, and the LSA system 17 causes the coordinate system for the wafer stage 9 to correspond to the coordinate system arranged on the wafer W. Alignment is then carried out using an EGA method or a site-by-site alignment method as well as the FIA system 25, as in the first embodiment. The pattern on the reticle R is exposed and transferred onto the wafer W so that it is in a specified relationship with the alignment marks provided on the wafer. In this case, exposure shots are those regions on the wafer W which will not be used for the manufacture of semiconductor circuits. For example, an alignment mark in a cutout shot in the periphery of the wafer or in a useless shot is used. The number of exposure shots is predetermined so that the base-line error (the variation of the base-line value) can be determined by averaging measurement errors and that exposure can be executed without reducing the throughput.

Figure 10A:
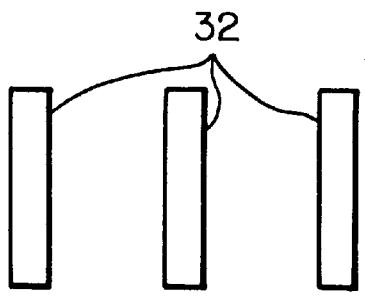
FIG. 10(a) shows a first pattern provided to detect overlay errors.
Figure 10B:
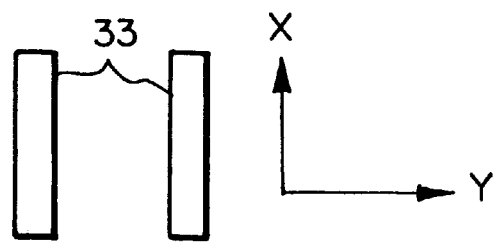
FIG. 10(b) shows a second pattern provided to detect overlay offsets.

After exposure has been carried out in this manner, a latent image of a second pattern 33 is formed on the wafer W in a specified positional relationship with a first pattern 32 formed in advance on the wafer, as shown in FIG. 10.

Figure 11A:
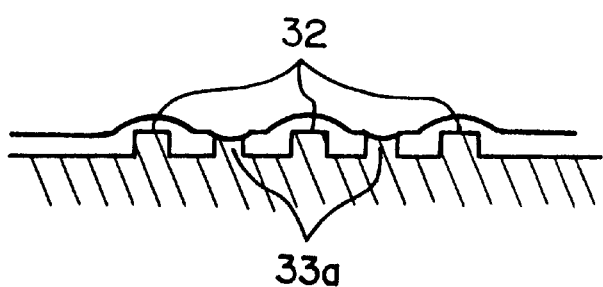
FIG. 11(a) shows the position of a latent image of a second pattern formed to overlap a first pattern.
Figure 11B:
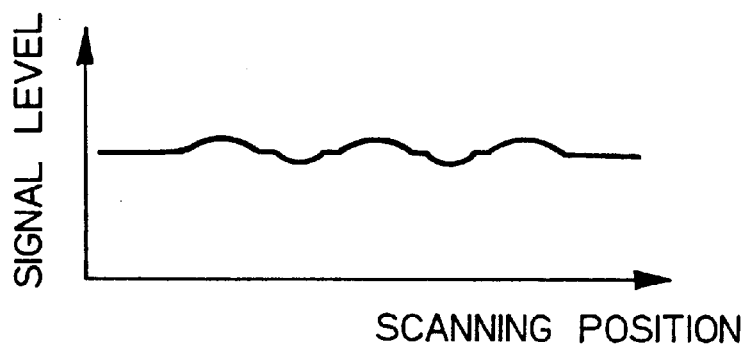
FIG. 11(b) shows the waveform of a signal obtained when the latent image of the second pattern formed to overlap the first pattern is measured by the interatomic force microscope.

The interatomic force microscope 18 then detects both the first pattern 32 and the latent image of the second pattern 33 in terms of the difference in level. This operation is also performed as in the first embodiment. As shown in FIG. 11(a), the resist is slightly depressed when a latent image 33a of the second pattern 33 is formed. FIG. 11 shows a signal waveform obtained when the interatomic force microscope 18 detects the first pattern 32 and the latent image of the second pattern 33. The positional relationship between the first pattern 32 and the latent image of the second pattern 33 is determined by processing this signal waveform. This positional relationship is obtained for each of exposed shots, and the obtained positional relationships are averaged to determine a positional relationship measured value. The base-line error of the FIA system 25 in the Y direction can then be determined from the difference between this measured value and a designed positional relationship between the first pattern 32 and the second pattern 33.

Exposure is similarly carried out in the X direction to detect the registration off set in order to determine the base-line error of the FIA system 25 in the X direction.

The determined base-line error is added to the base-line value of the FIA system 25 to obtain a new base-line value. This corrected base-line value is used to execute alignment with the EGA system, and exposure is carried out. Specifically, after measuring the base-line error, the EGA system is used to carry out alignment, and the wafer stage 9 is then moved to the exposure position based on the determined shot arrangement and the newly determined base-line value, thereafter exposure is carried out.

The registration error is detected either for each wafer or for each lot or every specified number of wafers, according to the stability of the base-line value.

Figure 12A:
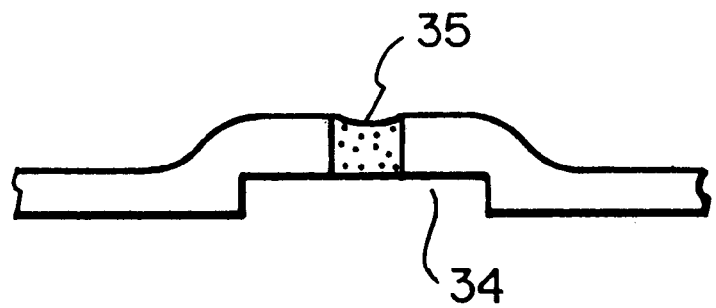
FIG. 12(a) shows the position of a latent image of a second pattern formed to overlap a first pattern that is larger than the second pattern.
Figure 12B:
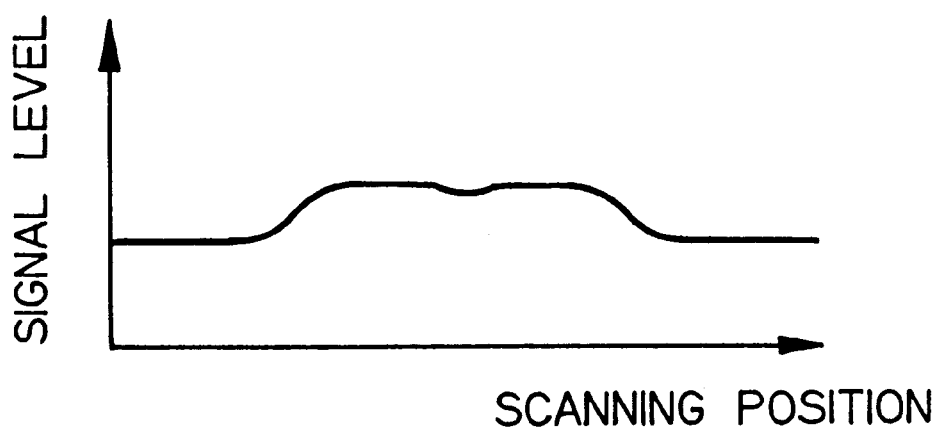
FIG. 12(b) shows the waveform of a signal obtained when the latent image is measured by the interatomic force microscope.

The shapes of the first pattern 32 and the positional pattern 33 and the positional relationship between them are not limited to the above forms. For example, the first pattern may be larger than the second pattern, and exposure may then be carried out so that the center of the first pattern 34 coincides with the center of the second pattern 35, as shown in FIG. 12. In this case, arithmetic processes can be simplified because both the first and the second patterns need to comprise only a single mark, and the offset between the first pattern 34 and the second pattern 35 is directly used as a base-line error.

The base-line error h as conventionally been measured prior to superimpose exposure by using predetermined instruments to detect the reference pattern (the vernier mark) of a test reticle which is formed on a wafer, and then inputted by the operator to an exposure apparatus for correction. The interatomic force microscope 18, however, enables the accurate detection of a latent image and alignment marks formed on a wafer without the need of development, thereby increasing the throughput and enabling accurate base-line error measurements. In addition, conventional methods for optically detecting a latent image using a wave length that is not sensed by a resist may have failed to accurately detect the position due to interference by lights reflected by both the surface of the resist and the surface of a substrate. The interatomic force microscope 18, however, enables marks to be detected accurately.

In the third embodiment, latent images and the interatomic force microscope 18 are used to measure the base-line error without the need of development in order to correct the base-line value. The second pattern may, however, be exposed to the first pattern and then developed, and the interatomic force microscope 18 may then be used to detect the registration error between the first pattern and the second pattern that is a developed image of the resist, thereby correcting the error in base-line value. In this case, the advantage that the interatomic force microscope 18 can detect marks accurately is not traded off.

In addition, this OFF-AXIS alignment system is not particularly limited to the FIA system, but other OFF-AXIS alignment systems may be used. Similar advantageous effects can be obtained by using TTL alignment systems such as TTL-LSA and TTL-FIA systems which are sensitive to the variation of the base-line value.

The embodiments according to this invention have been described; in these embodiments, the single interatomic force microscope 18 can perform detections in both the X and Y directions. Another interatomic force microscope may, however, be disposed in a plane extending along the Y axis and containing the center axis of the projection optical system to detect marks in the X direction, while the interatomic force microscope 18 disposed in a plane extending along the X axis and containing the center axis of the projection optical system is used to detect only the marks in the Y direction.

Although this invention has been described in conjunction with the exposure apparatus with the projection optical system, an exposure apparatus with a reflection optical system may be used with the interatomic force microscope 18 installed at a specified distance from the center of exposure visual field exposed to the photosensitive substrate (Example 1).

Furthermore, for a proximity apparatus, if the photosensitive layer must be directly detected in terms of the difference in level, the interatomic force microscope 18 may also be installed at a specified distance from the center of exposure visual field exposed to the photo10 sensitive substrate (Example 2).

The above embodiments have been described in conjunction with the interatomic force microscope (AFM). This is because scanning tunnelling microscopes (STM) can detect only conductive materials and cannot observe wafers coated with a resist that is not conductive. Conversely, microscopes other than interatomic force microscopes can be used if non-conductive materials are to be detected in terms of the difference in level. For example, near field microscopes can be used (Example 3).

As described above, this invention is not limited to the above embodiments or Examples 1 to 3, but may have various configurations without deviating from the intents thereof.

The exposure apparatus according to this invention detects the positions of alignment marks by carrying out relative scanning using a probe maintained at a specified vertical distance from the surface of the photosensitive substrate. This exposure apparatus can thus detect alignment marks with a small difference in height or an asymmetric shape, resulting in very accurate registration. Unlike optical alignment mark detection methods, this apparatus is not subject to the effect of interference and can accurately detect the positions of alignment marks.

The second positioning method according to this invention can detect the offset of the alignment means without the need of development. This enables the base-line value of the alignment means to be corrected, resulting in accurate positioning. The needlessness of development serves to increase the throughput of the overall manufacture process.

What is claimed is:

1. A position detecting apparatus which detects the position of a pattern for alignment formed on a substrate comprising:

a stage adapted to hold the substrate and two-dimensionally movable in a predetermined plane;

a sensor having a probe which moves along a direction perpendicular to said predetermined plane in response to the position of a surface of said substrate in said direction and outputs a signal which varies in response to said movement of said probe;

a position detecting device arranged nearby said stage, and which detects the position of said stage in said plane; and a measuring system which is electrically connected to said sensor and said position detecting device and which obtains the position of said pattern for alignment in said plane on the basis of signals which are output from said sensor and said position detecting device, respectively, when said pattern for alignment is moved relative to said probe.

2. An apparatus according to claim 1, wherein said probe is movable in said direction perpendicular to said plane in such manner that the distance between said probe and the surface of said substrate in said direction is maintained to be constant.

3. an apparatus according to claim 1, wherein photosensitive material is applied on the surface of said substrate, and wherein said probe is movable in a direction perpendicular to said plane in such a manner that interatomic force between said probe and the surface of the photosensitive material is maintained to be constant.

4. An apparatus according to claim 1, further comprising a sensor position measuring device which measures the position of said probe in said plane, wherein said measuring system obtains, during movement of said pattern for alignment, the position of said pattern for alignment in said plane on the basis of the signals which are output from said sensor, said position detecting device, and said sensor position measuring device respectively.

5. An exposure apparatus which exposes a predetermined pattern onto a substrate having a pattern for alignment and of which a surface is coated with photosensitive material comprising:

a stage adapted to hold the substrate and two-dimensionally movable in a predetermined plane;

a sensor having a probe which moves along a direction perpendicular to said predetermined plane according to the position of a surface of said substrate in said direction and outputs a signal which varies in response to said movement of said probe;

a position detecting device arranged nearby said stage, and which detects the position of said stage in said plane;

a measuring system which is electrically connected to said sensor and said position detecting device, and which obtains the position of the pattern for alignment in said plane on the basis of signals which are output from said sensor and said position detecting device, respectively, when said pattern for alignment is moved relative to said probe; and a control system which is electrically connected to said measuring system, and which controls movement of said stage on the basis of said obtained position.

6. An exposure apparatus according to claim 5, wherein said sensor outputs a signal which varies in response to relative movement between said pattern for alignment and a latent image formed on said photosensitive material and separated from said latent image with a predetermined distance.

7. An exposure apparatus according to claim 6, wherein said measuring system obtains the distance between said pattern for alignment and said latent image on the basis of said signal from said sensor.

8. A micro device fabricated by exposing the predetermined pattern onto the substrate via the exposure apparatus of claim 5.

9. A micro device according to claim 8, wherein the predetermined pattern is formed on a mask.

10. An exposure apparatus which exposes a substrate with a predetermined pattern comprising;

a stage which moves said substrate in a predetermined plane;

a sensor having a probe which moves in a direction perpendicular to said plane according to configuration of a surface of said substrate;

a detector arranged nearby said stage and which detects the position of said stage in said plane; and a measuring system which is electrically connected to said sensor and said detector, and which obtains the position of a mark on said substrate in said plane on the basis of signals which are output from said sensor and said detector, respectively, in response to relative movement between said probe and said mark due to movement of said stage.

11. An apparatus according to claim 10, wherein said mark is a mark having the difference in level and formed on said substrate, wherein said substrate has the surface covered by photosensitive material and wherein said sensor outputs, during movement of said stage, a signal which varies in response to movement of said probe relative to said surface of said photosensitive material in said direction perpendicular to said plane.

12. An apparatus according to claim 11, wherein said sensor is an interatomic force microscope in which said probe moves in said direction perpendicular to said plane an interatomic force between said surface of said photosensitive material and said probe is maintained to be constant.

13. An apparatus according to claim 10, wherein said substrate has the surface covered by said photosensitive material, wherein said mark is a latent image formed on said photosensitive material, and wherein said sensor outputs, during movement of said stage, a signal which varies in response to movement said relative to said surface of said photosensitive material in said direction perpendicular to said plane.

14. An apparatus according to claim 13, wherein said sensor is an interatomic force microscope in which said probe moves in said direction perpendicular to said plane so that an interatomic force between said surface of said photosensitive material and said probe is maintained to be constant.

15. An apparatus according to claim 10, wherein said substrated has the surface covered by photosensitive material, wherein said mark comprises a mark having the difference in level and formed on said substrate and a latent image formed on said photosensitive material, and wherein said measuring system determines the distance in said plane between said mark having the difference in level and said latent image.

16. An apparatus according to claim 15, wherein said sensor is an interatomic force microscope in which said probe moves in said direction perpendicular to said plane so that an interatomic force between said surface of said photosensitive material and said probe is maintained to be constant.

17. An apparatus according to claim 10, wherein said probe is disposed on an axis of a light beam which is emitted from said detector and reflected by a mirror on said stage.

18. An apparatus according to claim 17, wherein said sensor includes a mirror which reflects the light beam from said detector.

19. An apparatus according to claim 10, further comprising a device which detects movement of said probe in said plane;
wherein said measuring system determines the position of said mark in said plane on the basis of signals which are output from said sensor, said detector and said detecting device.

20. An apparatus according to claim 10, further comprising an alignment sensor which irradiates a light beam onto said mark so as to obtain the position of said mark on said substrate in said plane; and an alignment system which moves said mask and said substrate relative to each other on the basis of an output from said alignment sensor; wherein said measuring system detects the position of a latent image of said mark on said mask in said plane, said latent image being formed on photosensitive material covering the surface of said substrate, and said alignment system moves said mask and said substrate relative to each other on the basis of the detected position and said output from said alignment sensor.

21. An apparatus according to claim 10, further comprising an alignment sensor which irradiates a light beam onto said mark so as to obtain the position of said mark on said substrate in said plane; and an alignment system which moves said mask and said substrate relative to each other on the basis of the position of said mark obtained by at least one of said measuring system and said alignment sensor.

22. A micro device fabricated by exposing the predetermined pattern onto the substrate via the exposure apparatus of claim 10.

23. A micro device according to claim 22, wherein the predetermined pattern is formed on a mask.

24. An exposure apparatus comprising:
a stage which moves a substrate in a predetermined plane;
a first sensor arranged nearby the stage, and which irradiates a light beam onto a mark on said substrate;
a second sensor having a probe which moves in a direction perpendicular to said plane according to irregularity of said mark on said substrate during movement of said stage;
an alignment system which is electrically connected to the first and the second sensor, and which moves an image of a predetermined pattern and said substrate relative to each other on the basis of an output from at least one of said first and second sensors which are selected on the basis of said mark on said substrate so that said substrate is exposed with the predetermined pattern.

25. An apparatus according to claim 24, wherein said substrate has a surface covered by photosensitive material; and wherein said mark includes at least one of a mark having a difference in level formed on said substrate and a latent image formed on said photosensitive material.

26. An apparatus according to claim 24, further comprising a device which detects movement of said probe in said plane; wherein said alignment system moves said mask and said substrate relative to each other on the basis of said at least one output and an output from said detecting device.

27. An apparatus according to claim 24, further comprising a projection optical system which projects an image of a pattern on said mask onto said substrate; wherein said first sensor is an off-axis optical sensor which has an optical axis disposed in said plane at a position different from an optical axis of said projection optical system.

28. An apparatus according to claim 24, wherein said second sensor is an interatomic force microscope in which said probe moves in said direction perpendicular to said plane so that an interatomic force between said surface of said photosensitive material and said probe is maintained to be constant.

29. A micro device fabricated by exposing the predetermined pattern onto the substrate via the exposure apparatus of claim 24.

30. A micro device according to claim 29, wherein the predetermined pattern is formed on a mask.

31. An exposure apparatus, which exposes a predetermined pattern onto a substrate comprising:
a projection system, which is arranged nearby the substrate, and which projects an image of the pattern onto the substrate;
a stage which moves said substrate in a plane perpendicular to an optical axis of said projection system;
an off-axis alignment sensor, which is arranged nearby the stage, and which detects a mark on said substrate without presence of said projection system;
a detecting device, which is arranged nearby the alignment sensor, and which detects movement of part of said alignment sensor in said plane; and
a controller, which is electrically connected to the alignment sensor and the detecting device and the stage, and which controls movement of said stage on the basis of outputs from said alignment sensor and said detecting device.

32. An apparatus according to claim 31, wherein said alignment sensor includes a probe which moves in a direction along the optical axis of said projection optical system according to the difference in level of the mark on said substrate during movement of said stage.

33. An apparatus according to claim 31, wherein said substrate has a surface covered by photosensitive material and said mark includes at least one of an irregular mark formed on said substrate and a latent image formed on said photosensitive material.

34. A micro device fabricated by exposing the predetermined pattern onto the substrate via the exposure apparatus of claim 31.

35. A micro device according to claim 34, wherein the predetermined pattern is formed on a mask.

36. A position measuring method comprising the steps of:
exposing photosensitive material on a substrate having a first mark with a second mark so that a latent image of said second mark is formed on said photosensitive material;
moving said substrate along a predetermined so that each of said first mark and said latent image of said second mark, and a probe which moves in a direction perpendicular to said plane in response to the position of a surface of said photosensitive material in said direction are relatively moved along said plane; and obtaining, during movement of said substrate, positional information of said first mark and said latent image of said second mark in said plane on the basis of signals which are output from a sensor which detects the position of said substrate in said plane and a sensor having said probe, respectively.

37. A method according to claim 36, wherein the distance between said probe and the surface of said photosensitive material in said direction perpendicular to said plane is maintained to be constant during movement of said substrate.

38. A method according to claim 36, wherein said obtained information includes the distance in said plane between said first mark and said latent image of said second mark.

39. An exposure method for exposing a predetermined pattern onto a substrate through a projection system, the method comprising the steps of:

moving the substrate in a perpendicular plane perpendicular to an axis of said projection system;

detecting a mark formed on the substrate using an off-axis alignment system without presence of the projection system;

detecting movement of part of said alignment system in said plane; and moving an image of the predetermined pattern and the substrate relative to each other on the basis of detected results of the detecting steps.

40. A method according to claim 39, wherein said alignment system includes a probe which moves in a direction along the axis of said projection system according to the difference in level of the mark on the substrate during movement of the substrate.

41. A method for fabricating a micro device by exposing the predetermined pattern onto the substrate using the method according to claim 39.

42. A method according to claim 41, wherein the predetermined pattern is formed on a mask.

43. An exposure method for exposing a predetermined pattern onto a substrate, the method comprising the steps of:

moving the substrate in a predetermined plane;

detecting a mark formed on the substrate by receiving an irradiated light from the mark;

detecting movement of a probe which moves along a direction perpendicular to said predetermined plane according to a position of a surface of said substrate in the direction; and moving an image of the predetermined pattern and the substrate relative to each other on the basis of a detected result of at least one of the detecting steps.

44. A method according to claim 43, wherein said substrate has a surface covered by photosensitive material; and wherein said mark includes at least one of a mark having a difference in level formed in said substrate and a latent image on said photosensitive material.

45. A method according to claim 43, further comprising:
detecting second movement of said probe in said plane;
wherein said moving step includes moving the image of the predetermined pattern and the substrate relative to each other on the basis of said at least one detected result and a detected result of said second movement detecting step.

46. A method for fabricating a micro device by exposing the predetermined pattern onto the substrate using the method according to claim 43.

47. A method according to claim 46, wherein the predetermined pattern is formed on a mask.

48. An exposure method for exposing a predetermined pattern onto a substrate having a pattern for alignment, the method comprising the steps of:

moving the substrate in a predetermined plane;

detecting movement of a probe which moves along a direction perpendicular to said predetermined plane according to a configuration of a surface of said substrate;

detecting a position of said substrate in said plane; and obtaining a position information of said pattern for alignment in said plane on the basis of both results of the detecting steps.

49. A method according to claim 48, further comprising the step of:

controlling a position of said substrate on the basis of said position information obtained by the obtaining step.

50. A method according to claim 48, wherein the surface of said substrate is coated with a photosensitive material, and wherein said movement detecting step includes detecting a movement of said probe which moves in response to relative movement between said pattern for alignment and a latent image formed on said photosensitive material and separated from said latent image with a predetermined distance.

51. A method according to claim 50, wherein said obtaining step includes obtaining the distance between said pattern for alignment and said latent image on the basis of said result of the movement detecting step.

52. A method according to claim 48, wherein said movement detecting step is performed by an inter atomic force microscope in which said probe moves in said direction perpendicular to said plane so that an inter atomic force between said surface and said probe is maintained to be constant.

53. A method for fabricating a micro device by exposing the predetermined pattern onto the substrate using the method according to claim 48.

54. A method according to claim 53, wherein the predetermined pattern is formed on a mask.

55. An exposure method comprising the steps of:

irradiating a light beam from a first sensor onto a mark on a substrate moving in a predetermined plane so that the position of said mark in said plane is determined;

moving said substrate according to said determined position so that a latent image of a mark is formed on photosensitive material on said substrate;

moving a probe of a second sensor and said latent image relative to each other along said plane so that the position of said latent image is determined, said probe moving in a direction perpendicular to said plane according to the difference in level of the surface of said photosensitive material; and moving an image of a predetermined pattern and said substrate relative to each other on the basis of an output from said first sensor which detects an alignment mark on said substrate through said photosensitive material and said detected position of the latent image so that said photosensitive material is exposed with the predetermined pattern.

56. A method according to claim 55, wherein said first sensor is an off-axis sensor which has an optical axis of a projection optical system which projects an image of said pattern on said substrate; and wherein the position of said latent image is used to correct a base-line which corresponds to the positional deviation in said plane between the optical projection system and said optical axis of said first sensor.

57. A method for fabricating a micro device by exposing the predetermined pattern onto the substrate using the method according to claim 55.

58. A method according to claim 57, wherein the predetermined pattern is formed on a mask.

59. A positioning method comprising:

a first step preparing a photosensitive substrate having a photosensitive layer on the surface thereof and a plurality of processing regions each of which has a first alignment mark formed therein, a mask with a pattern including a second alignment mark and a reference point, and a moving stage on which the photosensitive substrate is placed;

a second step of detecting the positional coordinates of the respective first alignment marks in some processing regions by sequentially repeating an operation for moving said stage to move said photosensitive substrate to a first position in which an alignment means can detect the first alignment mark in one of the plurality of processing regions, thereby causing the alignment means to detect the positional coordinates of the mark;

a third step of performing a statistical arithmetic process based on the positional coordinates detected in the second step to determine the positional coordinates of the respective first alignment marks in all of the processing regions;

a fourth step of moving said photosensitive substrate to an exposure position by moving said stage based on a least (1) a base-line value representing the distance between the first position and a second position where said reference point is projected on said photosensitive layer and (2) the positional coordinates of the first alignment marks in predetermined processing regions which have been determined in the third step;

a fifth step of exposing the second alignment mark to form a latent image of the mark on the photosensitive layer;

a sixth step of relatively scanning a probe of the alignment means with respect to the surface of said photosensitive layer in such a way that the interatomic force between the probe and the surface of the photosensitive layer is maintained to be constant, thereby detecting the difference in level between the first alignment mark and the latent image to detect positional offset value between the first alignment mark and the latent image; and a seventh step of moving said stage to the exposure position based on at least the (1) positional coordinates determined in the third step, (2) base-line value, and (3) positional offset value detected in the sixth step.

60. A positioning method according to claim 59 further comprising between the sixth and the seventh steps, an eighth step of replacing said photosensitive substrate;

a ninth step of detecting the positional coordinates of the respective first alignment marks in some processing regions by sequentially repeating an operation for moving said stage to move said photosensitive substrate to a first position in which an alignment means can detect the first alignment mark in one of the plurality of processing regions, thereby causing the alignment means to detect the positional coordinates of the mark; and a tenth step of performing a statistical arithmetic process based on some positional coordinates detected in the ninth step to determine the positional coordinates in all of the processing regions;

wherein the seventh step is substituted by a 7th step wherein said stage is moved to the exposure position based on at least the (1) positional coordinates determined in the tenth step, (2) base-line value, and (3) positional offset value detected in the sixth step.

* * * * *